United States Patent [19]
Goldstein

[11] Patent Number: 5,265,151
[45] Date of Patent: Nov. 23, 1993

[54] METHOD OF IMPROVING MODEM PERFORMANCE BY CONTROLLING TRANSMITTED POWER OF MODEM, AND MODEM IMPLEMENTING THE SAME

[75] Inventor: Yuri Goldstein, Southbury, Conn.

[73] Assignee: General DataComm, Inc., Middlebury, Conn.

[21] Appl. No.: 736,088

[22] Filed: Jul. 26, 1991

[51] Int. Cl.5 .......................................... H04M 11/00
[52] U.S. Cl. ........................................ 379/97; 379/98; 375/58
[58] Field of Search .................... 379/97, 98, 93, 96; 371/5.5, 5.1; 375/58; 455/127

[56] References Cited

U.S. PATENT DOCUMENTS

| | | | |
|---|---|---|---|
| 4,580,262 | 4/1986 | Naylor et al. | 375/58 |
| 4,731,816 | 3/1988 | Hughes-Hartogs | 379/98 |
| 4,768,203 | 8/1988 | Ingle | 370/13 |
| 5,001,776 | 3/1991 | Clark | 455/308 |
| 5,128,965 | 7/1992 | Henriksson | 371/5.5 |

Primary Examiner—Jin F. Ng
Assistant Examiner—Stella L. Woo
Attorney, Agent, or Firm—David P. Gordon

[57] ABSTRACT

Methods for improving modem performance and apparatus incorporating the methods are provided. The preferred methods comprise measuring the signal/noise ratio and intermodulation distortion (IMD) relating to signals being transmitted over a channel, and adjusting the transmitting power of the transmitting modem below a maximum permissable power in response to the measurements in order to reduce the error rate of the data transmission, the error rate being a function of both the signal/noise ratio and the IMD. Theoretically, the power can be adjusted to an optimal level, as the decrease in power increases the error rate due to signal/noise ratio according to a first function, but decreases the error rate due to IMD according to a second function. A first preferred manner of determining the final power level to be utilized is to calibrate a modem according to the techniques (e.g., Trellis precoding, etc.) it utilizes, and to utilize a look-up table for that modem to identify the desired power level based on the measured signal/noise ratio and the measured IMD. A second preferred manner is to decrease the signal power according to a formula which is a function of the third harmonic IMD.

42 Claims, 4 Drawing Sheets

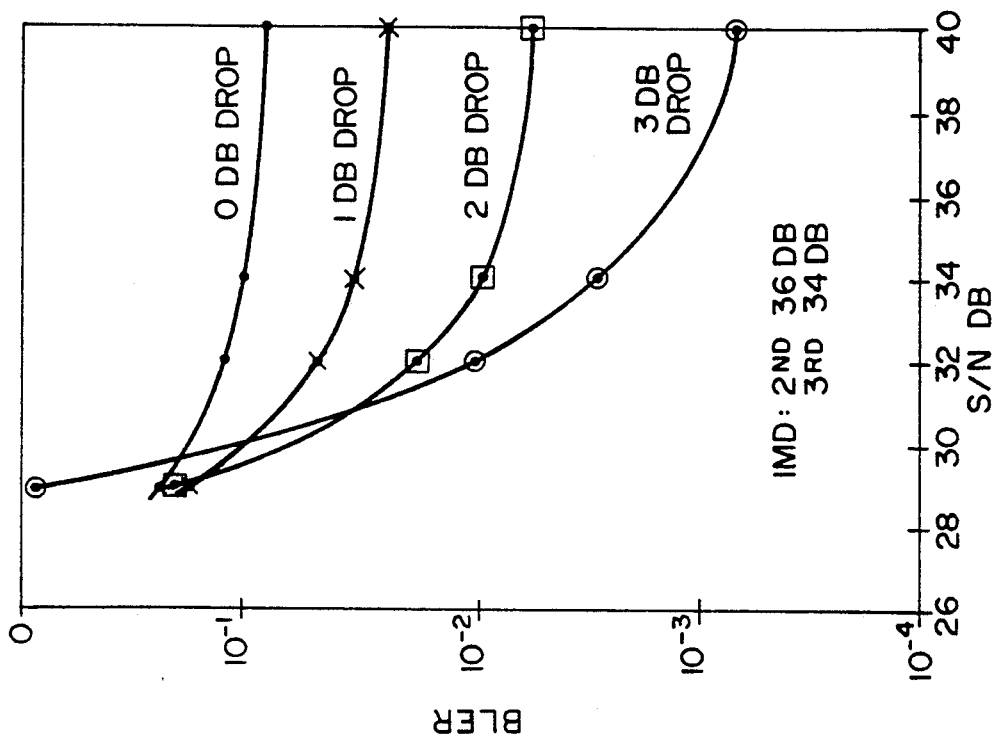
FIG. 3B  50% LINEAR DISTORTION
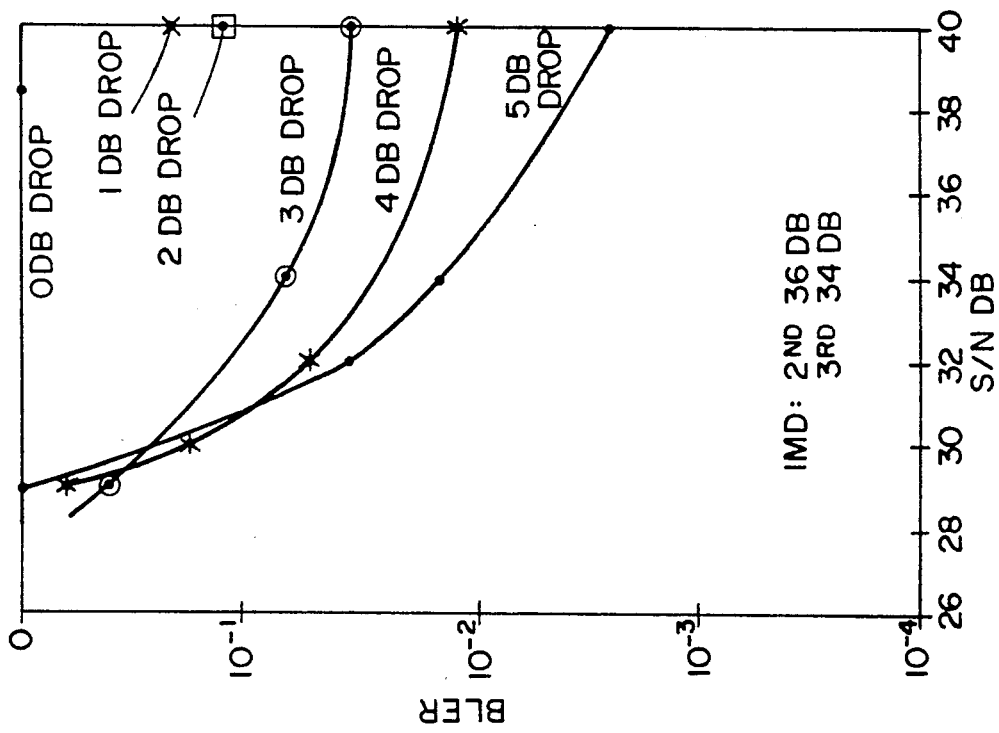
FIG. 3A  TRELLIS PRECODING

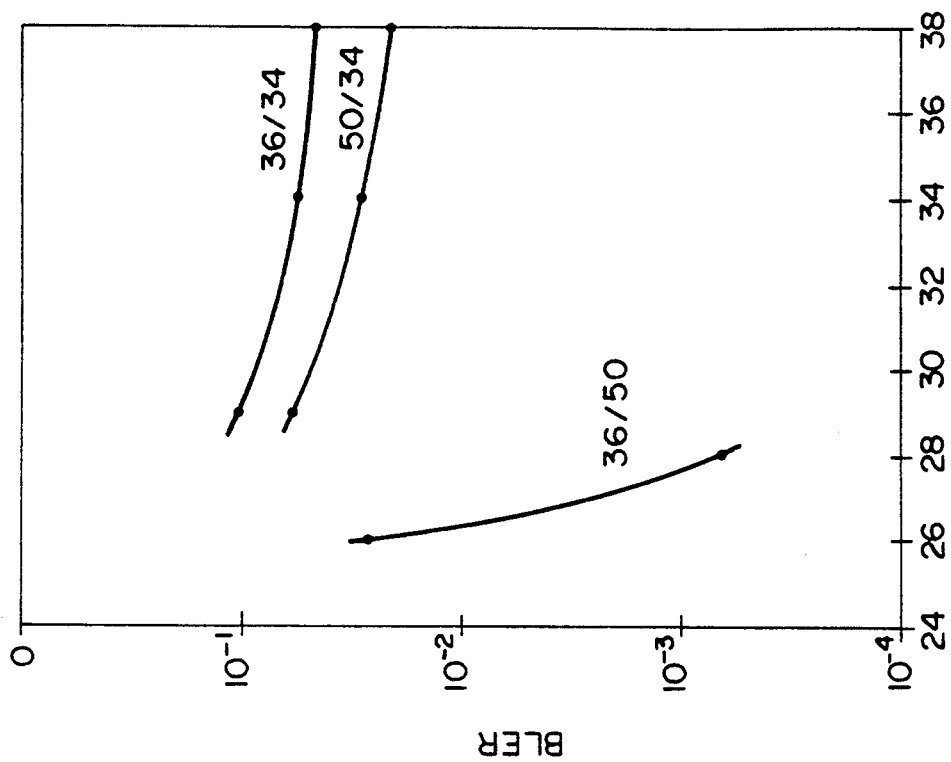
FIG. 5
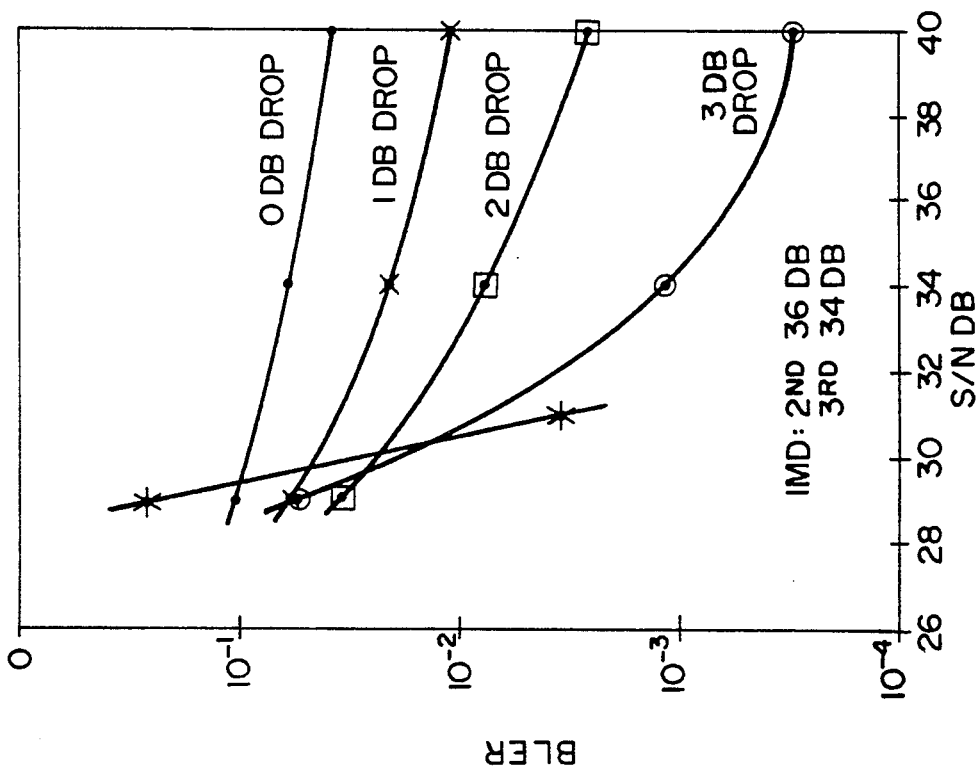
FIG. 3C  TRELLIS PRECODING PLUS
50% LINEAR PREDISTORTION

METHOD OF IMPROVING MODEM PERFORMANCE BY CONTROLLING TRANSMITTED POWER OF MODEM, AND MODEM IMPLEMENTING THE SAME

BACKGROUND

This application relates to data communication equipment such as modems. More particularly, this invention relates to methods and apparatus for improving the performance of data communication equipment independent of the transmission technology being utilized.

In transmission of data over a channel, the system performance is aggravated by different impairments. Some impairments, such as intersymbol interference (ISI), phase jitter, etc., can be removed by properly utilizing particular procedures and processing as is well known in the art. Other impairments which can effect performance in different manners and degrees cannot be removed. These other impairments include, inter alia, Gaussian noise, impulse noise, and intermodulation distortion (IMD).

In light of the impairments of the channel, it is desirable to increase the signal/noise ratio of the system. The increase of signal/noise ratio is all the more important in high speed modems such as 19.2 kbit/sec modems. Among the more technically advanced techniques for increasing signal/noise ratio, some of which are presently being proposed as standards for a two-wire full-duplex modem (V.fast), are: Trellis shaping (see, e.g., G. David Forney, Jr., "Trellis Shaping", *IEEE Information Theory Workshop*; CCITT Study Group XVII & Working Parties, Geneva 15-23 Oct. 1990 Temporary Document 211-E); Trellis precoding (see, e.g., G. David Forney, Jr., "Trellis Precoding: Combined Coding, Precoding and Shaping for Intersymbol Interference Channels", *IEEE Information Theory Workshop*; CCITT Study Group XVII & Working Parties, Geneva 15-23 Oct. 1990—Temporary Document 212-E); fifty percent linear equalization (see, e.g., CCITT, Question 3XVII, WP XVII/1 "Preliminary Test Results—AT&T's Candidate Proposal for V.fast" and "DFE versus Preemphasis for V.fast" COM-XVII- E, April 1991); and shaping without Trellis (see, e.g., U.S. Ser. No. 07/651,563 to Cole and assigned to the assignee hereof). In fact, it is possible to utilize different combinations of the proposed techniques. Regardless of the techniques proposed, it is common practice to cause the signal being transmitted and carried by the channel to be as large as possible (i.e., typically 0±0.5 dBm), thereby guaranteeing that the signal/noise ratio is as large as possible.

The function of the Trellis shaping, Trellis precoding, and shaping without Trellis techniques is to effectively maximize the distance (in n-space) between transmitted points of a constellation under average power constraints. By effectively increasing the distance between the points, the signal/noise ratio is increased. The function of the fifty percent equalization technique is to decrease noise enhancement of the linear equalizer, thereby improving the signal/noise ratio. As is disclosed in the above-referenced articles "Preliminary Test Results—AT&T's Candidate Proposal for V.fast" and "DFE versus Preemphasis for V.fast" which suggest utilizing fifty percent linear equalization, not only is the signal/noise ratio improved, but the impact of intermodulation distortion is decreased. As a result, the total error rate is reduced. The reason for the decrease in impact of intermodulation distortion, however, was not understood.

While each of the proposed techniques for V.fast has its own advantages and disadvantages, clearly it would be advantageous to increase modem performance above and beyond the proposed techniques.

SUMMARY OF THE INVENTION

It is therefore an object of the invention to provide methods and apparatus for improving modem performance regardless of other techniques utilized.

It is another object of the invention to provide methods and apparatus for improving modem performance by controlling the transmitted power of the modem.

It is a further object of the invention to provide methods and apparatus for optimizing modem performance by decreasing the transmitted power of the modem.

In accord with the objects of the invention, the method for improving modem performance broadly comprises measuring the signal/noise ratio and IMD relating to signals being transmitted over a channel, and adjusting the power of transmitted signal below the maximum permissable power in response to the measurements in order to reduce the error rate of the data transmission, the error rate being a function of both the signal/noise ratio and the IMD. Theoretically, the power can be adjusted to an optimal level, as the decrease in power increases the error rate due to signal/noise ratio according to a first function, but decreases the error rate due to IMD according to a second function.

Any of numerous schemes for deciding what the final power level should be can be utilized. A first preferred scheme is to calibrate a modem according to the techniques (e.g., Trellis precoding, etc.) it utilizes, and to utilize a look-up table for that modem to identify the desired power level based on the measured signal/noise ratio and the measured IMD. A second preferred scheme is to decrease the signal power according to a formula. A preferred formula is to decrease the signal $[(42-x)/2]$ dB if the signal/noise ratio is greater than 30 dB, decrease the signal $[(42-x)/4]$ dB if the signal/noise ratio is between 29 and 30 dB, and to do nothing if the signal/noise ratio is below 29 dB, where x is preferably the third harmonic of the IMD. A third scheme for reducing the power level is to send signals of different power levels, and make measurements relating to the error rate. In al three schemes, the desired power level, or a corrective signal would be sent back to the transmitting modem. A fourth scheme is to measure the quality of points in a constellation, to send a corrective signal back to adjust the power, and to iterate until a threshold is met or an optimum is found. Numerous other effective schemes will present themselves to those skilled in the art.

The measurements of signal/noise ratio and IMD are similarly accomplished by any of numerous well known techniques. Preferred techniques include using the standardized four tone method for measuring IMD, and using a single notched tone for measuring signal/noise ratio. Other techniques include using a single tone and measuring second and third harmonics for IMD, and using the four tone signal and measuring the power of noise between the four tone spectral lines and the power of the signal at the spectral lines to find signal/noise ratio. Measurement of IMD and signal/noise ratio can occur during probing, or at other times during the handshake and/or transfer of data. In fact, measurement can be continuous for an adaptive system. Likewise, the transfer of information from the receiving modem to the sending (transmitting) modem for indicating the appropriate power level for operating over the particular channel being utilized can occur during probing, or at other times during the handshake and/or transfer of data.

The apparatus of the invention essentially comprises a microprocessor and memory already resident in conjunction with the receiving section of a modem, and an attenuator typically resident in the transmitting section of a modem, where the attenuator is responsive to information received from the receiving modem for appropriately adjusting the transmitting power of the transmitting modem. The microprocessor must be properly programmed to measure IMD and signal/noise ratio (if not already programmed to do the same). Depending upon the scheme utilized for determining final power, the microprocessor may have to conduct mathematical and logic operations, may have to address a look-up chart stored in memory, or may have to compare different error rate information.

The methods and apparatus of the invention not only improves the performance of modems vis-a-vis error rate, but in modems with echo cancellers, improves the performance of the echo cancellers. Also, the methods of the invention suggest that the answer to the question as to why fifty percent linear equalization was causing decrease in IMD is that fifty percent linear equalization causes decrease in energy at the location(s) where nonlinearity exists.

Additional objects and advantages of the invention will become apparent to those skilled in the art upon reference to the detailed description in conjunction with the accompanying drawings.

BRIEF DESCRIPTION OF THE DRAWINGS

FIG. 3a is a graph showing block error rates versus signal/noise ratio for Trellis precoding with signal attenuation of 0, 1, 2, 3, 4, and 5 dB in the presence of an IMD of 36/34 dB.

FIG. 3b is a graph showing error bock rates Versus signal/noise ratio for fifty percent linear equalization with signal attenuation of 0, 1, 2, and 3 dB in the presence of an IMD of 36/34 dB.

FIG. 3c is a graph showing block error rates versus signal/noise ratio for Trellis precoding with fifty percent linear equalization with signal attenuation of 0, 1, 2, 3, and 4 dB in the presence of an IMD of 36/34 dB.

FIG. 5 is a graph showing block error rate versus signal/noise ratio for Trellis precoding with IMD's of 36/34 dB, 36/50 dB, and 50/34 dB.

DETAILED DESCRIPTION OF THE PREFERRED EMBODIMENTS

Figure 1:
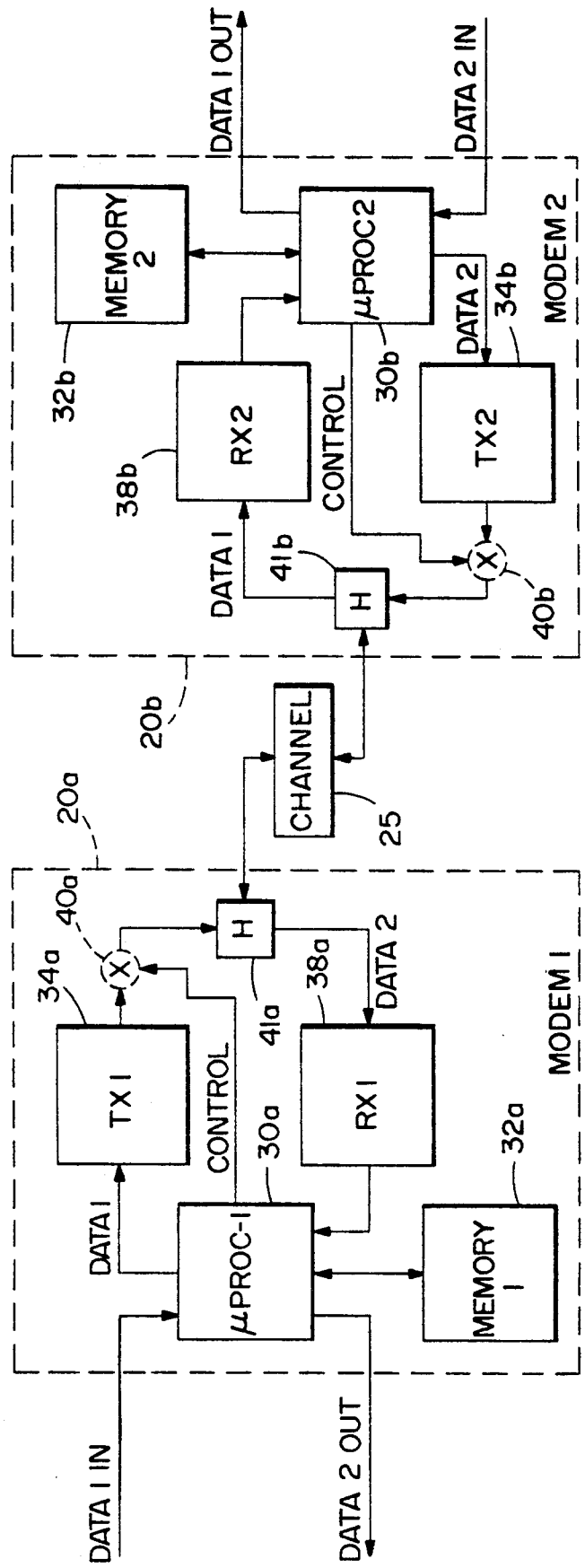
FIG. 1 is a high level block diagram of two full-duplex modems in accord with the invention which are communicating over a channel.

Turning to FIG. 1, a high level diagram is seen of two two-wire full-duplex modems 20a and 20b communicating over channel 25. Channel 25 may be any medium and is not limited to wire. The modems 20a and 20b preferably each include a microprocessor means 30a, 30b having accompanying program and data memory 32a, 32b, a transmitter section means 34a, 34b, and receive section means 38a, 38b, and a hybrid circuit (2/4 and 4/2 wire splitter) 41a, 41b. In addition, and in accord with the invention, the modems each include an attenuator means 40a, 40b, which as will be described in more detail below are carefully controlled to improve modem performance. Because the attenuator means 40 may be part of the transmitter means 34 or even accomplished in the microprocessor means 30 as will be more completely discussed with reference to FIGS. 2a and 2b, the attenuator means of FIG. 1 are shown in phantom.

The flow of data (signals) through a modem is typically as follows. Data being sent via channel 25 from modem 20a (modem 1) to modem 20b (modem 2) which for purposes of convenience is referred to as data 1, is received by modem 20a from a source of data, processed (e.g., shaped, and/or precoded, and/or preequalized, etc. and modulated) by microprocessor means 30a which may include a D/A converter, sent to transmitter 34a, attenuated at 40a, and sent via hybrid circuit 41a onto channel 25 as analog data. In typical prior art modems, the attenuation at attenuator 40a is arranged to cause the signal to be as large as permissable. As will be discussed in detail hereinafter, in accord with the present invention, attenuation is controlled to be a function of the noise and IMD of channel 25.

While in channel 25, the data is subjected to noise and IMD. Upon receipt at modem 20b, data 1 is forwarded by hybrid circuit 41b to receiver 38b, which in turn forwards the data to microprocessor 30b for demodulation, decoding as necessary, etc. The resulting data is sent in digital form as data 1 out to its destination.

Data flow of data (signals) being sent via channel 25 from modem 20b to modem 20a, which for purposes of convenience is referred to as data 2, is much the same as the flow of data 1. Data 2 received by modem 20b from a source of data, is processed by microprocessor means 30b which may include a D/A converter, sent to transmitter 34b, attenuated suitably at 40b, and sent via hybrid 41b onto channel 25 as analog data. It should be noted that the channel which carries data 2 is different (at least in parts) than the channel which carries data 1, even though both channels are indicated as channel 25 in FIG. 1. While in channel 25, the data 2 is subjected to noise and IMD. Because the channel for data 2 is different than the channel for data 1, the noise and IMD to which data 2 is subjected are different than the noise and IMD to which data 1 is subjected. Upon receipt at modem 20a, data 2 is forwarded by hybrid circuit 41a to receiver 38a, Which in turn forwards the data to microprocessor 30a for demodulation, decoding as necessary, etc. The resulting data is sent in digital form as data 2 out to its destination.

Figure 2A:
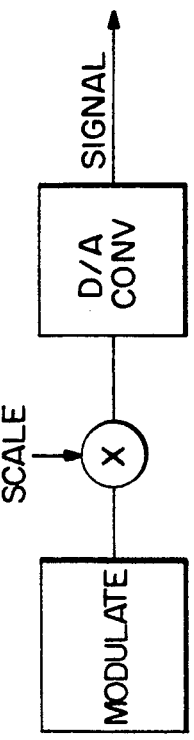
FIGS. 2a and 2b are block diagrams showing the transmitter sides of modems where attenuation is accomplished in an analog manner and in a digital manner respectively.
Figure 2B:
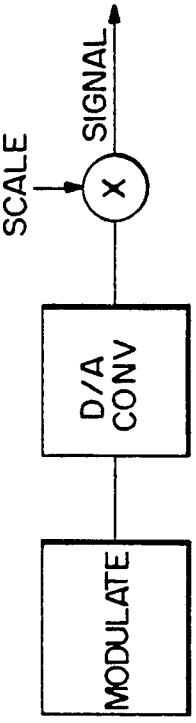

As aforementioned, the controlled attenuation of the data previous to sending over the channel is the crucial aspect of the invention. As used herein, the term "attenuation" is intended to include both an increase in energy and a decrease in energy. As indicated in FIGS. 2a and 2b, the attenuation may be accomplished while the data is in digital form or in analog form. In particular, as shown in FIG. 2a, digital data is modulated by a modulator 51a, converted from digital to analog form by a D/A converter 53a, and then attenuated by attenuator 55. The attenuator 55 of FIG. 2a may take any of numerous known forms. A standard textbook form for a controllable analog attenuator is a series of resistors and switches.

As shown in FIG. 2b, the attenuation of the signal may be accomplished in a digital manner as well. In FIG. 2b, the data is modulated by modulator 51b, attenuated by attenuator 57, and then converted from analog to digital form by D/A converter 53b. The attenuator 57 of FIG. 2b may take any of numerous known forms. A standard textbook form for a controllable digital attenuator is a multiplier.

Because attenuation may be accomplished in digital or analog form, in any of numerous ways, it will be appreciated by those skilled in the art that the attenuation may be accomplished by different circuitry. For example, particularly where attenuation is digital, a microprocessor is well suited to carrying out the attenuation through the simple process of multiplication. However, because in many modems of the art, the transmitters of the modems are already equipped with attenuators, it will be appreciated that controlled attenuation is easily accomplished at the transmitter.

Regardless of the details of where or via what circuitry attenuation is accomplished, in accord with the invention, the amount of attenuation should be controlled in response to a function of the noise and IMD of the communication channel. Thus, according to the preferred embodiment, during training, probing, and/or handshaking, the receiving modem (e.g., modem 20b receiving data 1 from modem 20a) measures the signal/noise ratio and the IMD relating to signals (data 1) being transmitted over the channel (25). As will be discussed hereinafter, any manner of measuring signal/noise ratio and IMD may be utilized. While the measurements of signal/noise ratio and IMD are made by microprocessor 30b of modem 20b, it will also be appreciated that such measurements can be made by any suitable circuitry in the receiving modem. Based on the measured signal/noise ratio and IMD, and using any of numerous schemes, a few preferred schemes of which are discussed below, the receiving modem 20b communicates to the sending modem 20a control information. Based on the control information, the sending modem 20a adjusts or controls the power of the transmitted signal. As will be discussed below, theoretically, the power can be adjusted to an optimal level to reduce error to a minimum, as the decrease in power increases the error rate due to signal/noise ratio according to a first function, but decreases the error rate due to IMD according to a second function.

Any of numerous schemes for deciding what the final power level should be can be utilized. A first preferred scheme is to calibrate a modem according to the techniques (e.g., Trellis precoding, etc.) it utilizes, and to utilize a look-up table (programmed into memory such as 32) for that modem to identify the desired power level based on the measured signal/noise ratio and the measured IMD. The calibration of a modem may be seen with reference to FIGS. 3a–3c and 4. As shown in FIG. 3a, for a modem using Trellis precoding, and for a channel having a measured IMD of 36/34 dB, if the power of the transmitted signal is maintained at its maximum permissable level (e.g. 0 dB drop), the block error rate for the transmission will be one regardless of the signal/noise ratio; i.e., no transmission can be successfully accomplished. If the power of the transmitted signal is dropped 1 dB or 2 dB, as shown in FIG. 3a, unless the signal/noise ratio is very large (e.g., 36 dB or larger), the block error rate will still be very large. However, when the power of the transmitted signal is dropped 3 dB, while the signal/noise ratio will drop by 3 dB, the IMD will be decreased substantially. Thus, as seen in FIG. 3a, if full power signal/noise is for example 34 dB, by dropping the power of the transmitted signal by 3 dB, the block error rate decreases from 1 to $7.5 \times 10^{-1}$. If the full power signal/noise was 32 dB, the drop in power by 3 dB decreases the block error rate from 1 to approximately $1.2 \times 10^{-1}$. Even at a full power signal/noise level of 29 dB, the block error rate is decreased from 1 to about 0.38.

As seen in FIG. 3a, a further decrease of power by 4 dB in the Trellis precoding modem with an IMD of 36/34 dB will be more effective than the power drop of 3 dB provided that at full power the signal/noise level is greater than 29.5 dB. For example, at 34 dB, a drop in the power level by 4 dB results in a block error rate of approximately $3.6 \times 10^{-2}$ as opposed to $7.5 \times 10^{-2}$ for the 3 dB drop. However, at 29 dB, a power drop of 5 dB results in a block error rate of approximately 0.68 which is worse than the block error rate exhibited when the power is dropped by 3 dB. Similarly, a decrease of power by 5 dB in the Trellis precoding modem with an IMD of 36/34 dB will be more effective than the power drop of 4 dB provided that at full power the signal/noise level is greater than about 30.7 dB. For example, at a signal/noise ratio of 34 dB, a drop in the power level by 5 dB results in a block error rate of approximately $1.5 \times 10^{-2}$ as opposed to $3.6 \times 10^{-2}$ for the 4 dB drop. However, at 29 dB, a power drop of 5 dB results in a block error rate of 1 which is worse than the block error rate exhibited when the power is dropped by 4 dB or 3 dB.

While additional curves are not provided in FIG. 3a, those skilled in the art will appreciate that the block error rate of the Trellis precoding modem can be tested at different power drops to whatever degree of granularity is desired. Resulting curves will then provide the information which will permit a look-up table to be generated. For example, utilizing only the 1 dB, 2 dB, 3 dB, 4 dB and 5 dB drop information of FIG. 3a, the look-up table or the modem could store the following information: if the IMD is 36/34 dB, then where the signal/noise ratio at full power is greater than 30.7 dB, decrease 5 dB; and where the signal/noise ratio at full power is between 29.5 dB and 30.7 dB, decrease 4 dB; else decrease 3 dB. The actual implementation of the look-up table could include a dB drop value (e.g. drop 4 dB) or the desired power level (e.g., send at −4 dBm) for each level of signal/noise ratio for each IMD level. Where additional information is provided for other dB decreases, the look-up table information could include additional values.

It should be appreciated that the ability to get improved performance by decreasing the power of the transmitted signal is not dependent upon the coding technique utilized in transmitting data (although the amount of gain is somewhat dependent on the technique). For example, where fifty percent linear equalization is utilized, as shown in FIG. 3b, for a channel having an IMD of 36/34 dB, improved performance is always available. Without decreasing the power of the transmitted signal, block error rates of 0.24, 0.12, 0.1, and 0.08 are respectively obtained at signal/noise ratios of 29, 32, 34, and 40 dB. With a 1 dB drop in power of the transmitted signals, the block error rates drop to 0.18, 0.05, 0.036 and 0.025 at similar full power signal/noise ratios. The following block error rate chart shows a further comparison of drops of 0, 1, 2, and 3 dB for the fifty percent linear equalization modem with IMD of 36/34 dB, with the 30 dB points being interpolated:

| S/N full power ratio | 29 dB | 30 dB | 32 dB | 34 dB | 40 dB |
|---|---|---|---|---|---|
| dB drop | | | | | |
| 0 | .24 | .19 | .12 | .10 | .08 |
| 1 | .18 | .11 | .05 | .036 | .025 |
| 2 | .25 | .10 | .020 | .010 | .006 |
| 3 | .67 | .08 | .011 | .003 | .0007 |

With such an arrangement, if a look-up chart is utilized, the look-up chart might indicate (as indicated in the chart by the underlinings) that at a signal/noise ratio of 30 dB or better, a of 3 dB should be utilized; otherwise a dB drop of 1 dB should be utilized. Of course, if better optimization is desired, the granularity could be changed such that the switchover from the 3 dB drop to the 1 dB drop would occur at a full power signal/noise ratio of about 29.6 rather than 30 dB. Also, it will be appreciated that with additional information regarding different dB drops, finer resolution can be obtained.

Turning to FIG. 3c, the block error rates incurred at different power drops for a Trellis precoded modem which also utilizes fifty percent linear equalization is seen. Again, in chart form the block error rates appear as follows:

| S/N full power ratio | 29 dB | 30 dB | 32 dB | 34 dB | 40 dB |
|---|---|---|---|---|---|
| dB drop | | | | | |
| 0 | .11 | .09 | .07 | .06 | .045 |
| 1 | .055 | .043 | .029 | .021 | .011 |
| 2 | .035 | .025 | .012 | .008 | .003 |
| 3 | .055 | .017 | .003 | .0012 | .0003 |
| 4 | .27 | .03 | <.001 | <.0010 | <.0001 |

With the provided chart, it is seen that for maximizing performance, at a full power signal/noise ratio of 32 dB or more, the transmitted signal power should be decreased by 4 dB. At between 30 dB and 32 dB, the signal power should be decreased by 3 dB. At between 29 dB and 30 dB, the signal power should be decreased by 2 dB. Referring to FIG. 3c, it will be appreciated that with finer granularity, the switchover from a reduction of 3 dB to a reduction of 4 dB best occurs at about 30.5 dB rather than at 32 dB. Likewise, the switchover from a reduction of 2 dB to a reduction of 3 dB best occurs at about 29.5 dB rather than at 30 dB.

Figure 4:
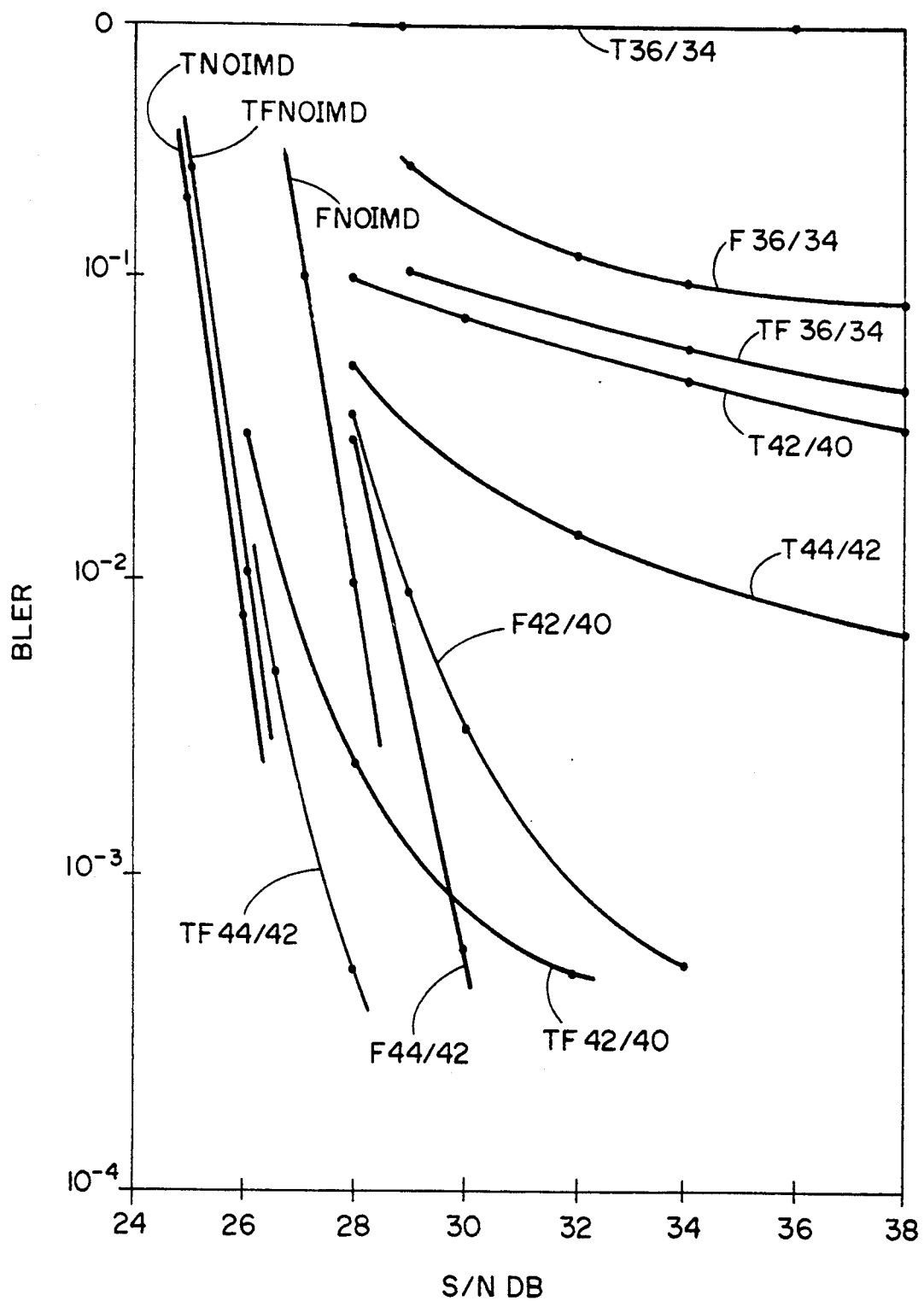
FIG. 4 is a graph showing block error rate versus signal/noise ratio for Trellis precoding, fifty percent linear equalization, and Trellis precoding with fifty percent linear equalization all without signal attenuation and in the presence of no IMD, and IMD's of 44/42 dB, 42/40 dB and 36/34 dB.

Turning to FIG. 4, the error rates of modems utilizing Trellis precoding, fifty percent linear equalization, and Trellis precoding and fifty percent linear equalization is shown at maximum power but at different IMD levels. The curves noted by T36/34, F36/34, and TF36/34 are replicas of the Zero dB reduction curves of FIGS. 3a, 3b, and 3c respectively, where IMD is at 36/34 dB. The curves noted by TNOIMD, T44/42 T42/40, FNOIMD, F44/42, F42/40 and TFNOIMD, TF44/42 and TF42/40 show the error for modems with Trellis precoding (T), fifty percent linear equalization (F), and Trellis precoding with fifty percent linear equalization (TF) where there is no IMD (NOIMD) and at IMDs of 14/42 dB and 42/40 dB respectively. A close look at FIG. 4 reveals that at IMDs of 44/42 dB, the block error rates for the different types of coding are very similar to the block error rates that would be obtained if there were no IMD. Hence, typically, with an IMD of 44/42 dB, there is no incentive to decrease the power of the transmitted signal as the block error rate due to a decrease in signal/noise ratio would more than offset any gain due to decreased IMD. However, at IMDs of 42/40 dB, some improvement is possible and desirable in certain signal/noise ranges. Thus, a series of calibration tests can be run for each IMD combination and for each coding technique (Trellis precoding, fifty percent linear equalization, etc.), which would generate a series of graphs similar to FIGS. 3a-3c at each IMD. From the graphs, decisions can be made as to how much to drop the power of the transmitted signal given a particular signal/noise ratio. This decision information can then be stored in a look-up table memory as suggested above with reference to FIGS. 3a-3c.

While the graphs of FIGS. 3a-3c and 4 relate to particular IMDs, and the IMDs chosen are IMDs where the second and third harmonics are separated by 2 dB with the third harmonic being larger than the second (i.e., "larger" indicating less in dB according to the accepted definition; e.g., 36/34, 42/40), it will be appreciated that a full series of calibrations can be done with all different IMDs (e.g. 39/37 dB, 42/35 dB, 38/41 dB, etc.). It is believed, however, that the third harmonic is of most import, and that the second harmonic can be ignored without losing much accuracy. That the second harmonic can be largely ignored is seen with reference to FIG. 5 where the block error rate is charted versus the signal/noise ratio for a Trellis precoding modem with three different IMDs: 36/34 dB; 50/34 dB; and 36/50 dB. A review of FIG. 5 shows that a large movement of the IMD second harmonic from 36 dB to 50 dB does not effect the block error rate nearly as much as a large movement of the IMD third harmonic from 34 dB to 50 dB. Thus, one manner of decreasing the amount of information to be stored in a look-up table is to only keep look-up tables relating to the third harmonic of the IMD.

According to a second preferred scheme for finding a desired transmitted signal power level, no look-up table is required at all. Rather, the signal is decreased in power by algorithms which depend on the IMD and the signal/noise ratio. A preferred algorithm is: decrease the maximum power by $[(42-x)/2]$ dB if the signal/noise ratio is greater than 30 dB; decrease the signal $[(42-x)/4]$ dB if the signal/noise ratio is between 29 and 30 dB; and decrease the power by 0 dB (i.e., send at maximum permissable power) if the signal/noise ratio is below 29 dB, where x is preferably the third harmonic of the IMD. The algorithm is generated first by the realization gained from FIG. 4, that at a third harmonic IMD of 42 dB or less (e.g., 43 dB), a decrease in transmitted energy will hardly decrease the block error rate due to IMD (hence $42-x$); second by the realization gained from FIGS. 3a-3c that at a signal/noise ratio of about 30 dB, a large dB drop in transmitted power is typically the most effective (hence divide by two); and third by the realization that at between 29 dB and 30 dB better results are obtained by a smaller dB drop in transmitted power (hence divide by four). At 29 dB or below, while the algorithm suggests no decrease in power, those skilled in the art will recognize that regardless of efforts, modem performance will be unacceptable. Thus, changing transmission power is essentially futile.

While a particular algorithm is suggested for automatically decreasing transmitted energy without aid of a look-up table, other effective algorithms, including more complex algorithms and/or algorithms with finer granularity will present themselves to one skilled in the art.

It will also be appreciated that when using a look-up chart, or when using an algorithm based on IMD and signal/noise ratios to reduce power, information such as a desired power level (send at −3 dBm), or a corrective signal (e.g., decrease by 4 dB from maximum) must be sent by the receiving modem back to the transmitting modem. Those skilled in the art will appreciate that the transfer of information from the receiving modem to the sending (transmitting) modem for indicating the appropriate power level for operating over the particular channel being utilized can be accomplished in numerous ways and can occur during probing, or at other times during the handshake and/or transfer of data. In fact, if measurements are made at intervals or continuously during data transmission, and appropriate information is sent back to the transmitting modem, the system can adapt to changes in the channel which might occur during data transmission.

A third scheme for adjusting the power level in order to improve modem performance is to cause the transmitting modem to send signals of different power levels, and to cause the receiving modem to make measurements relating to the error rate for each power level. By automatically sending signals of different power levels, the need for addressing a look-up table, or conducting a mathematical operation based on various measurements is eliminated. Rather, all that is required is that the error rate at each different power level be determined, and that the error rates be compared. If the comparison takes place at the receiving modem, information regarding the optimal power level can be sent back to the transmitting modem. Alternatively, if the receiving modem sends back information regarding error rates at different power levels, the transmitting modem may make the comparison and adjust its transmitter power level accordingly.

A fourth scheme for adjusting the power level in order to improve modem performance is to measure the quality of points in a constellation or the error rate for the power level. Based on the measurement and a decision metric and/or threshold determination, a corrective signal is sent from the receiving modem to the transmitting modem to adjust the power. With an adjusted power, another measurement is made regarding quality of points in a constellation or the error rate, and the decision metric and/or threshold determination is repeated. A second corrective signal is then sent. The procedure is iterated until a threshold is met or an optimum is found.

It will be appreciated by those skilled in the art that numerous other effective schemes for adjusting the power level in order to improve modem performance will present themselves to those skilled in the art.

The preferred methods and apparatus for improving modem performance require the measurement of a signal/noise ratio and the measurement of IMD. These measurements are accomplished by any of numerous well known techniques. Preferred techniques include using the standardized four tone method for measuring IMD, and using a single notched tone for measuring signal/noise ratio; both of which are disclosed in detail in *IEEE Standard Methods and Equipment for Measuring the Transmission Characteristics of Analog Voice Frequency Circuits*; ANSI/IEEE Standard 743-1984, which is hereby incorporated by reference herein. Other techniques for measuring IMD include using a single tone and measuring either the second and third harmonics or only the third harmonic, as the third harmonic is of primary import as discussed above with reference to FIG. 5. Another technique for measuring the signal/noise ratio uses the four tone signal. The technique comprises measuring the power of the noise between the four tone spectral lines by squaring and integrating the noise signal located therebetween, and measuring the power of the signal at the spectral lines by similarly squaring and integrating. The ratio of the two then provides the signal/noise ratio.

It will be appreciated by those skilled in the art that the measurement of IMD and the measurement of the signal/noise ratio can occur during probing, or at other times during the handshake and/or transfer of data. In fact, measurement can be substantially continuous to permit an adaptive system.

The apparatus of the invention relates closely to the method invention, and as aforementioned essentially comprises a microprocessor and memory already resident in conjunction with the receiving section of a modem, and an attenuator typically resident in the transmitting section of a modem, where the attenuator is responsive to information received from the receiving modem (typically via microprocessor commands) for appropriately adjusting the transmitting power of the transmitting modem. The microprocessor must be properly programmed in well known manners to measure IMD and signal/noise ratio (if not already programmed to do the same). Depending upon the scheme utilized for determining final power, the microprocessor will either conduct mathematical and logic operations, address a look-up chart stored in memory, will compare different error rate information, or will conduct other operations as required. It is well within the skill of one skilled in the art to program the microprocessor and memory suitably to perform the tasks required by the teachings of the invention.

There have been described and illustrated herein methods for improving modem performance via controlling the transmitted power of the modem, and modem implementing the methods. While particular embodiments of the invention have been described, it is not intended that the invention be limited thereby, as it is intended that the invention be as broad in scope as the art will allow. Thus, it is understood by those skilled in the art that while the invention was described with reference to a particular modem (19.2 Kbit/sec two wire full-duplex), the invention applies to all modems. Similarly, while the invention was described with reference to modems having microprocessors, memories, etc., it will be appreciated that the modems having dedicated circuitry for performing the measurements and methods described can be utilized. Further, while particular schemes, algorithms, and circuitry for adjusting the power level were described, it will be appreciated that numerous other schemes, algorithms, and circuitry could be effectively utilized to carry out the methods of the invention. Also, while particular graphs for modems utilizing specific techniques were provided in accord with the preferred embodiments, it will be appreciated that similar graphs relating to modems utilizing other techniques could be generated and utilized. In fact, the provided graphs could be expanded to show wider ranges of transmitter power decrease (i.e., beyond 5 dB) although decreasing by more than 5 dB is typically not preferred. Likewise, the provided graphs could be expanded to provide a finer granularity of transmitter power decrease (e.g, by 0.5 dB or 0.25 dB gradations), although the actual block error decrease obtainable thereby will be relatively small. Also, while measured error was discussed in terms of "block error rate", it will be appreciated that any error rate could be measured. Finally, while error rates of signals were described primarily as being a function of signal/noise ratio and IMD, it will be appreciated that other indicators of error rate may be used to determine error rate and may be measured, and that other impairments may be effected by a change in the power of the transmitted signal. The invention is therefore intended to encompass other measurements related to error rate (i.e., error rate indicators). Therefore, it will be appreciated by those skilled in the art that yet other modifications could be made to the provided invention without deviating from its spirit and scope as so claimed.

I claim:

1. A method of improving the performance of a communication system where a first modem is transmitting signals over a channel including a telephone line over which said signals are transmitted to a second modem which makes measurements related to the data transmission error rate, said method comprising:

adjusting the transmitting power of said first modem to a level below a maximum permissable level for said channel in response to the measurements related to the data transmission error rate in order to reduce the error rate of data transmission from said first modem over said channel, wherein said measurements related to the data transmission error rate comprise measurements of the signal/noise ratio and intermodulation distortion (IMD) of said signals which were transmitted over said channel, wherein said data transmission error rate is a function of at least both said signal/noise ratio and said IMD.

2. A method according to claim 1, wherein:
said transmitting power is adjusted to a substantially optimal level.

3. A method according to claim 1, further comprising:
calibrating at least one of said first and second modems, wherein said calibrating step is used in said step of adjusting.

4. A method according to claim 3, wherein:
said step of calibrating comprises generating a table relating an adjustment in transmitting power or a desired transmitting power to said measured signal/noise ratio and said IMD.

5. A method according to claim 4, wherein:
said step of generating a table comprises
testing a modem substantially similar to said modem to be calibrated at different power levels over channels having different IMD levels and different signal/noise ratios,
comparing the error rates obtained for each of said channels at said different power levels, and
assigning and storing a plurality of either power level indicators or power drop indicators, each power level indicator or power drop indicator relating to a preferred transmitting power for a channel exhibiting a particular combination of IMD level and signal/noise ratio.

6. A method according to claim 1, wherein:
said step of adjusting comprises adjusting said transmitting power to a power level equal to said maximum permissable power minus a power defined by a function of said IMD.

7. A method according to claim 6, wherein:
said function of said IMD is $[(42-x)/2]$ dB, wherein x is a third harmonic of said IMD.

8. A method according to claim 6, wherein:
said function of said IMD changes based on said signal/noise ratio measured.

9. A method according to claim 8, wherein:
said function of said IMD is $[(42-x)/2]$ dB when said signal/noise ratio is greater than approximately 30 dB, and said function of said IMD is $[(42-x)/4]$ dB when said signal/noise ratio is less than approximately 30 dB, wherein x is a third harmonic of said IMD.

10. A method for improving the performance of a communication system where a first modem communicates over a channel including a telephone line over which said signals are transmitted to a second modem, comprising:

a) sending signals from said first modem over said channel to said second modem;

b) measuring at said second modem at least one indicator of the data transmission error rate;

c) sending transmitting power control information from said second modem to said first modem in response to the at least one measured error rate indicator; and d) adjusting the transmitting power of said first modem to a level below a maximum permissable level for said channel in response to said transmitting power control information in order to reduce the data transmission error rate of said first modem over said channel, wherein said at least one indicator comprises the signal/noise ratio and IMD of said signals being sent over said channel, wherein said data transmission error rate is a function of at least both said signal/noise ratio and said IMD.

11. A method according to claim 10, wherein:
said transmitting power is adjusted to a substantially optimal level.

12. A method according to claim 11, wherein:
said step of calibrating comprises generating a table relating an adjustment in transmitting power or a desired transmitting power to said measured signal/noise ratio and said IMD.

13. A method according to claim 10, further comprising:
e) calibrating at least one of said first and second modems, wherein said calibrating step is used in said step of adjusting.

14. A method according to claim 13, wherein:
said step of generating a table comprises
testing a modem substantially similar to said modem to be calibrated at different power levels over channels having different IMD levels and different signal/noise ratios,
comparing the error rates obtained for each of said channels at said different power levels, and
assigning and storing a plurality of either power level indicators or power drop indicators, each power level indicator or power drop indicator relating to a preferred transmitting power for a channel exhibiting a particular combination of IMD level and signal/noise ratio.

15. A method according to claim 10, wherein:
said step of adjusting comprises adjusting said transmitting power to a power level equal to said maximum permissable power minus a power defined by a function of said IMD.

16. A method according to claim 15, wherein:
said function of said IMD is $[(42-x)/2]$ dB, wherein x is a third harmonic of said IMD.

17. A method according to claim 15, wherein:
said function of said IMD changes based on said signal/noise ratio measured.

18. A method according to claim 17, wherein:
said function of said IMD is $[(42-x)/2]$ dB when said signal/noise ratio is greater than approximately 30 dB, and said function of said IMD is $[(42-x)/4]$ dB when said signal/noise ratio is less than approximately 30 dB, wherein x is a third harmonic of said IMD.

19. A method according to claim 10, wherein:
said measuring step is accomplished during at least one of a probing procedure and a handshake procedure.

20. A method according to claim 19, wherein:
said measuring step is further accomplished during transmission of data from said first modem to said second modem.

21. A method for improving the performance of a communication system having a first modem which communicates over a channel including a telephone line over which said signals are transmitted to a second modem, comprising:
  a) sending first signals from said first modem over said channel to said second modem at a first power level;
  b) sending second signals from said first modem over said channel to said second modem at a second power level;
  c) measuring at said second modem the data transmission error rates relating to said first and second signals being sent over said channel;
  d) comparing said data transmission error rates to each other; and
  e) adjusting the transmitting power of said first modem to a level below a maximum permissable level for said channel and to the power level of the signals having the lower data transmission error rates in response to said comparing step in order to reduce the data transmission error rate of said first modem over said channel.

22. A method according to claim 21, wherein:
said step of comparing is accomplished at said second modem, and said second modem sends information to said first modem to indicate which of said first and second power levels is preferred.

23. A method according to claim 21, wherein:
said second modem sends to said first modem information relating to said first and second error rates, and
said first modem compares said error rate information, in order to detemine which of said first and second power levels is preferred.

24. A method according to claim 21, further comprising:

sending third signals from said first modem over said channel to said second modem at a third power level, and
measuring at said second modem the data transmission error rates relating to said third signals being transmitted over said channel, wherein
said comparing step includes comparing said data transmission error rates relating to said third signals with said data transmission error rates relating to said first and second signals.

25. A method according to claim 24, further comprising:
said step of comparing is accomplished at said second modem, and said second modem sends information to said first modem to indicate which of said first, second, and third power levels is preferred.

26. A method according to claim 24, wherein:
said second modem sends to said first modem information relating to said first, second and third error rates, and
said first modem compares said error rate information, in order to detemine which of said first, second, and third power levels is preferred.

27. A method for improving the performance of a communications system having a first modem which communicates over a channel including a telephone line over which said signals are transmitted to a second modem, comprising:
  a) sending signals from said first modem over said channel to said second modem at a particular power level;
  b) measuring at said second modem one of the data transmission error rate relating to said signals being transmitted over said channel and the quality of points in a constellation which said first signals represent;
  c) sending from said second modem to said first modem control information in response to one of said measured error rate and said quality;
  d) adjusting the transmitting power of said first modem to a level below a maximum permissable level for said channel in response to said information; and
  e) repeating steps a) through d) in order to reduce the data transmission error rate of said first modem over said channel, wherein in adjusting the transmitting power in order to reduce the data transmission error rate, the power may be adjusted up or down in response to an increase in measured error rate.

28. A method according to claim 27, wherein:
steps a) through d) are repeated until either an acceptable error rate threshold is met or an optimum transmitting power is found.

29. In a first modem having transmitter means for transmitting signals over a channel including a telephone line over which said signals are transmitted to a second modem which has measurement means for making measurements related to the data transmission error rate related to said signals which were transmitted over said channel, an improvement in said first modem comprising:
attenuator means coupled with said transmitter means for adjusting the transmitting power of said transmitter means to a level below a maximum permissable level for said channel in response to the measurements made by said measurement means of said second modem in order to reduce the error rate of the data transmission from said first modem over said channel, wherein said measurements related to the error rate comprise measurements of the signal/noise ratio and intermodulation distortion (IMD) of said signals which were transmitted over said channel, wherein said error rate is a function of at least both said signal/noise ratio and said IMD.

30. The improvement of claim 29, wherein:

said first modem further comprises a digital processing means for modulating a data signal, and said attenuator means comprises a digital multiplier for multiplying said modulated data signal so as to adjust the power of said modulated data signal, wherein said first modem is provided with a digital to analog converter for converting said modulated data signal into an analog data signal.

31. The improvement of claim 29, wherein:

said first modem further comprises a digital to analog converter for converting modulated digital signals into analog signals, and said attenuator means comprises an analog circuit means for adjusting the power of said analog sigals.

32. The improvement of claim 29, wherein:

said first modem further comprises receiver means for receiving a control signal from said second modem regarding a desired power at which said transmitter means of said first modem should transmit data to said second modem over said channel.

33. The improvement of claim 32, wherein:

said first modem further comprises processor means for receiving said control signal from said receiver means, and sending information to said attenuator means for adjusting the transmitting power of said transmitter means.

34. The improvement of claim 33, wherein:

said measurements related to the error rate comprise measurements of the signal/noise ratio and intermodulation distortion (IMD) of said signals which were transmitted over said channel, wherein said error rate is a function of at least both said signal/noise ratio and said IMD, and said first modem further comprises measurement means for measuring the signal/noise ratio and intermodulation distortion (IMD) of second signals which were transmitted over a second channel, and memory means for storing a table relating an adjustment in transmitting power or a desired transmitting power to said measured signal/noise ratio and said IMD of said second signals.

35. The improvement of claim 34, wherein:

said first modem further comprises measurement means for measuring the signal/noise ratio and intermodulation distortion (IMD) of second signals which were transmitted over a second channel, and said processor means further comprises calculation means for calculating a transmitting power adjustment.

36. The improvement of claim 35, wherein:

said transmitting power adjustment is calculated according to a function of said IMD.

37. The improvement of claim 36, wherein:

said function of IMD is $[(42-x)/2]$ dB, wherein x is a third harmonic of said IMD.

38. The improvement of claim 36, wherein:

said function of said IMD changes based on said signal/noise ratio measured.

39. In a first modem having transmitter means and receiver means, said transmitter means for transmitting signals over a channel having a telephone line over which said signals are transmitted to a second modem which has means for measuring the data transmission error rate related to said signals which were transmitted over said channel, and said receiver means for receiving signals from said second modem, an improvement in said first modem comprising:

attenuator means coupled with said receiver means and said transmitter means, for adjusting the transmitting power of said transmitter means to send first and second signals of different power levels to said second modem, wherein said second modem measures first and second data transmission error rates related to said first and second signals, and one of said first and second modems compares said data transmission error rates to each other to find the power level having the lower data transmission error rates, and means for adjusting the transmitting power of said transmitter means to a level below a maximum permissible level for said channel in response to the power level of the signals having the lower data transmission error rates in order to reduce the error rate of the data transmission from said first modem over said channel.

40. The improvement of claim 39, wherein:

said second modem includes comparison means for comparing said first and second data transmission error rates, wherein said second modem sends information to said first modem to indicate which of said first and second power levels is preferred.

41. The improvement of claim 39, wherein:

said second modem sends to said first modem information relating to said first and second data transmission error rates, and said second modem comprises comparison means for comparing said data transmission error rate information.

42. In a first modem having transmitter means and receiver means, said transmitter means for transmitting signals over a channel including a telephone line over which said signals are transmitted to a second modem which has means for measuring at least one of the data transmission error rate related to said signals which were transmitted over said channel and the quality of points in a constellation which said signals represent, and said receiver means for receiving signals from said second modem, an improvement in said first modem comprising:

attenuator means coupled to said receiver means and said transmitter means, for adjusting the transmitting power of said transmitter means to send signals of different power levels to said second modem in response to control signals received by said receiver means of said first modem from said second modem, wherein said second modem measures one of the data transmission error rates related to said signals and quality of said points in said constellation and sends to said first modem said control information for adjusting the transmitting power of said transmitter means to a level below a maximum permissable level for said channel, and after said transmitter power is adjusted to send second signals at a second power level, said second modem measures one of a second data transmission error rate related to said second signals and a second quality of points in said constellation and sends second control signals to further adjust the transmitting power of said transmitter means to another level below said maximum permissible level, wherein in adjusting the transmitting power in order to reduce the data transmission error rate, the power may be adjusted up or down in response to an increase in measured error rate.

* * * * *